United States Patent [19]
Kochi et al.

[11] Patent Number: 5,812,231
[45] Date of Patent: Sep. 22, 1998

[54] DISPLAY UNIT

[76] Inventors: Tetsunobu Kochi; Mamoru Miyawaki; Shunsuke Inoue; Takanori Watanabe, all c/o Canon Kabushiki Kaisha 30-2, 3-chome, Shimomaruko, Ohta-ku, Tokyo, Japan

[21] Appl. No.: 492,247

[22] Filed: Jun. 19, 1995

[30] Foreign Application Priority Data

| Jun. 20, 1994 | [JP] | Japan | 6-137322 |
| Jun. 2, 1995 | [JP] | Japan | 7-136967 |

[51] Int. Cl.⁶ .......... G02F 1/1345; G02F 1/136; H01L 29/04; G09G 5/00
[52] U.S. Cl. .............. 349/151; 349/43; 257/72; 345/206
[58] Field of Search .......... 359/54, 59; 345/90, 345/91, 92, 205, 206; 349/149, 151, 43; 257/72, 59

[56] References Cited

U.S. PATENT DOCUMENTS

| 3,765,747 | 10/1973 | Pankratz et al. | 359/59 |
| 5,159,422 | 10/1992 | Tashiro et al. | 257/59 |
| 5,218,232 | 6/1993 | Yuzurihara et al. | 257/754 |
| 5,247,375 | 9/1993 | Mochizuki et al. | 359/54 |
| 5,403,762 | 4/1995 | Takemura | 437/40 |
| 5,412,240 | 5/1995 | Inoue et al. | 257/347 |
| 5,434,441 | 7/1995 | Inoue et al. | 257/347 |
| 5,530,266 | 6/1996 | Yonehara et al. | 359/59 |
| 5,604,360 | 2/1997 | Zhano et al. | 257/72 |

FOREIGN PATENT DOCUMENTS

| 0530972 | 3/1993 | European Pat. Off. . | |
| 544229 | 6/1993 | European Pat. Off. | 257/72 |
| 0586147 | 3/1994 | European Pat. Off. . | |
| 610969 | 8/1994 | European Pat. Off. | 359/59 |
| 2066545 | 7/1981 | United Kingdom | 359/59 |

Primary Examiner—William L. Sikes
Assistant Examiner—Tiep H. Nguyen
Attorney, Agent, or Firm—Fitzpatrick, Cella, Harper & Scinto

[57] ABSTRACT

A high-density impurity semiconductor region having the same conductivity type as a single-crystal silicon substrate is formed in addition to a main circuit portion of a peripheral circuit on the single-crystal silicon substrate. This semiconductor region is connected to a given potential point directly leading to an electric source. Alternatively, at a part of the peripheral drive circuit, a high-density impurity semiconductor region having a conductivity type reverse to that of the single-crystal silicon substrate is formed, and this semiconductor region is connected to a given potential point directly leading to an electric source. This can solve the problem that photocarriers (electrons and/or holes) caused by the light having not cut off and having entered into the single-crystal silicon region may enter into the peripheral drive circuit through the single-crystal silicon substrate to cause misoperation of the circuit.

21 Claims, 19 Drawing Sheets

DISPLAY UNIT

BACKGROUND OF THE INVENTION

1. Field of the Invention

The present invention relates to a highly reliable display unit incorporated with a drive circuit, that can operate normally even under irradiation by light without misoperation.

2. Related Background Art

Nowadays, our society is rapidly becoming rich in information, where, for example, the multimedia attracts great concerns. In particular, as interfaces which can substitute CRTs (cathode ray tubes) and connect computers and human beings, thin-type flat display units are important devices for expanding the multimedia market. Liquid-crystal display (LCD), plasma display (PDP) and electron-ray flat display are prominent flat display units. Among these, liquid-crystal display units have gained a great share at the market as small-sized personal computers have become popular. Among the liquid-crystal display units, active matrix liquid-crystal display units are free of crosstalk compared with simple matrix liquid-crystal display units of an STN type or the like, and can provide a large contrast over the whole screen. Hence, the active matrix liquid-crystal display units have attracted notice as not only display units for small-sized personal computers but also as video camera view finders, projectors, and thin-type television sets.

In the active matrix liquid-crystal display units, there are two types of active matrix systems, one of which is a two-terminal type system making use of switching devices operated by diodes and the other type is a three-terminal type system making use of switching devices operated by transistors. The three-terminal type active matrix system is a drive system in which a common electrode is provided on one substrate, a picture element electrode for each picture element is provided on the other substrate and a thin-film transistor (hereinafter "TFT") is provided as a switching device for each corresponding picture element to perform control functions.

The TFT is comprised of two main electrodes called the source electrode and the drain electrode and a control electrode called the gate electrode. In the above active matrix system, one of the main electrodes is connected to a signal line, the other of the main electrodes to the picture element electrode, and the gate electrode to a scanning line.

Incidentally, which of the main electrodes of the transistor serves as the source electrode may depend on the number of the transistor and the polarity of applied voltage. Accordingly, in the present specification, the side connected to the display signal line is called the source electrode, and the side connected to the picture element electrode the drain electrode.

FIG. 15 illustrates an equivalent circuit of an active matrix liquid-crystal display unit to which the present invention can be applied. In the drawing, reference numeral 1 denotes a TFT; 2, a scanning line; 3, a signal line; 4, a picture element electrode; 5, a horizontal shift resister; 6, a vertical shift resister; 7, a picture signal transmitting switch driven by the horizontal shift resister; 8, a holding capacitance for temporarily holding picture signals; and 9, a second picture signal transmitting switch that totally transmits to the picture element electrode the picture signals temporarily held in the holding capacitance. The picture signals are successively transmitted from a picture signal input terminal 10 at lagged timing. Reference numeral 11 denotes a reset switch of the signal line 3.

FIG. 16 illustrates drive pulse timing of this active matrix liquid-crystal display unit. As the picture signals, signals corresponding to odd numbered lines and signals corresponding to even numbered of lines are transmitted alternately for each field period. Accordingly, the liquid-crystal display unit operates as follows: First, in the odd-number field, scanning signals are first transmitted from the vertical shift resister 6 to a scanning line on an odd-numbered line (ODD1) and the TFT 1 on the odd-numbered line is electrified. In the meantime, with regard to picture signals to be recorded in liquid crystals, the picture signals are recorded in the picture element electrodes 4(2) and 4(4) of the respective picture elements through the transmitting switches successively driven by a horizontal shift resister 5(ODD) that generates horizontal scanning pulses synchronized with the picture signals.

At the same time, picture signals are transmitted to the holding capacitance 8 through the transmitting switch 7 driven by a horizontal shift resister 5(EVEN) that generates horizontal scanning pulses synchronized with the picture signals. Next, in the period of horizontal blanking, the reset switch 11 is electrified to once reset the signal line 3. Thereafter, scanning signals are transmitted to a scanning line on an even-numbered line (EVEN1), the TFT 1 on the even-numbered line is electrified, and at the same time the second picture signal transmitting switch is electrified, so that the picture signals are recorded in the picture element electrodes 4(1) and 4(3) of the respective picture elements.

In response to the voltage of the signals transmitted in this way, liquid-crystal molecules constituting a cell move to cause a change in transmittance of the liquid-crystal cell in accordance with the direction of a polarizing plate separately provided relatively to a cross polarizer. How it changes is shown in FIG. 19A.

Signal voltage value VSIG shown as abscissa in FIG. 19A is known to have a different content depending on the liquid crystal used. When, for example, a twist nematic (TN) liquid crystal is used, the value is defined as an effective voltage value (Vrms). This value can be qualitatively explained as shown in FIG. 19B. More specifically, in order to prevent DC components from being applied to the liquid crystal, signals are applied while changing the polarity of the signal voltage for each frame, where the liquid crystal itself behaves in response to AC voltage components shown in the drawing by shaded areas. Thus, when the time corresponding to one frame is $t_F$ and the signal voltage transmitted to the liquid crystal is $V_{LC}$, the effective voltage (Vrms) can be represented by the following equation.

$$V_{rms} = \sqrt{\frac{1}{t_F} \int_0^{t_r} (V_{LC}(t) - V_{com})^2 dt}$$

The transmittance of liquid crystal increases with an increase in this effective voltage Vrms.

As a means for improving resolution in the horizontal direction, there is a method in which the picture elements are arranged at positions shifted by, e.g., 0.5 picture element. By such arrangement, when, for example, spaces between certain picture elements on odd-numbered lines and picture elements adjacent thereto are viewed with the sense of parallel direction, it follows that picture elements on even-numbered lines fill the spaces, so that the horizontal resolution is apparently improved. Here, as shown in the timing diagram of FIG. 17, the timing of horizontal scanning pulses must be made different between odd-numbered lines and even-numbered lines in conformity with the spatial shift between the picture elements on the odd-numbered lines and even-numbered lines.

Usually, in liquid-crystal display units, as previously mentioned, signals are applied while changing the polarity of signal voltage, in order to prevent DC components from being applied to the liquid crystal to cause burning of liquid crystal. At the time of switchover of the polarity, a little change is caused in the transmittance of the liquid-crystal cell. For example, in the period of 1/30 seconds, this change is perceived by a person and appears as an unsteady brightness, i.e., a flicker. Employing the two-line simultaneous drive system where the same picture signals are written in odd-numbered lines and even-numbered lines, as described above, the polarity of picture signals can be reversed at a period of every 1/60 second, which is ½, whereby the flicker can be prevented.

FIG. 18 diagrammatically illustrates a cross section of a basic liquid-crystal display unit to which the present invention can be applied. In FIG. 18, reference numeral 401 denotes a gate electrode; and 402, a semiconductor formed of single-crystal silicon, polycrystalline silicon or amorphous silicon, which serves as a channel region of the transistor. Reference numeral 403 denotes a source electrode; and 404, a drain electrode. Reference numeral 405 denotes interlayer insulating layers; 406, a single-crystal silicon substrate, which can be formed of bulk Si; 407, an orienting film; 408, a liquid-crystal material; 409, an opposing transparent electrode; 410, an interlayer film; 411, a light-screening layer; and 412, a color filter layer. In the case of monochromatic display panel, this color filter layer, 412, is not provided.

Reference numeral 413 denotes an opposing transparent substrate. Reference numeral 414 denotes a semiconductor diffused layer formed in the single-crystal silicon substrate 406, having a conductivity reverse to that of the substrate, which serves as a channel region of the transistor. Reference numeral 415 denotes a gate electrode, formed in the same step as the thin-film transistor gate electrode 401. The gate electrode 415 and the channel region 414 face each other interposing an insulating layer between them. Reference numerals 416 and 417 denote source and drain electrodes of the transistor formed in the single-crystal silicon substrate.

Reference numeral 418 denotes an electrode of the semiconductor diffused layer. Reference numeral 419 denotes a transparent picture element electrode, and is connected to the drain electrode 404. Reference numeral 420 denotes an accumulated capacitance common electrode for holding charges of the picture element electrode portion, which forms an accumulated capacitance, and forms the accumulated capacitance between it and the picture element electrode 419. This is omitted in the equivalent circuit diagram in FIG. 15. Picture signals are recorded in the picture element electrode at the desired timing. The picture element region consists of the thin-film transistor and the transparent picture element electrode connected with its drain electrode, formed on the interlayer insulating layers 405. The single-crystal silicon substrate at the lower part of the picture element region is etched away as shown in FIG. 18 so as to be transparent to visible light.

Under the constitution as described above, peripheral drive circuits required to operate at a high speed can be produced using a single-crystal silicon having a large mobility. Hence, such peripheral drive circuits can be made up with single-crystal silicon transistors operable at a high speed. Also, the transistors serving as picture element switches can be made up with thin-film transistors having a small leak current, having a low terraced portion with a thickness of 1,000 Å or less and may cause faulty orientation with difficulty, and hence it is possible to set up transmission type liquid-crystal display units that can achieve a high contrast ratio at a high resolution.

FIGS. 7A to 14 diagrammatically illustrate a production process for accomplishing such constitution. FIG. 7A illustrates the formation of a p-type well in an n-type Si substrate. An oxide film formed on the substrate is masked using a resist, and boron ions are implanted to form a p-type well. FIG. 7B illustrates the step of placing a resist for forming LOCOS (an oxide film for device separation). An SiN (silicon nitride) film is deposited on the surface, and the film is patterned.

FIG. 8A illustrates the formation of LOCOS. In the figure, numeral 81 denotes field oxide layer. Wet oxidation is carried out at 1,000° to 1,100° C. so that an oxide film can be formed in a thickness of from 400 nm to 1,500 nm. FIG. 8B illustrates the step of forming SiN on the surface. In the figure, numerals 82, 83 and 84 denote buffer oxide film, NSG film and LP-SiN, respectively. An SiN film is deposited by thermal CVD in a thickness of from 50 nm to 100 nm. FIG. 8C illustrates the formation of polycrystalline silicon on the surface, which serves as picture element TFTs. Polycrystalline Si is deposited in a thickness of from 50 nm to 400 nm, followed by patterning.

FIG. 9A illustrates the step of regulating the threshold value of the n-type TFT by implantation of p-type ions. In the figure, numeral 91 denotes TFT poly-Si film. Ion implantation is carried out in an ion density of from $10^{12}$ to $10^{14}$ cm$^{-3}$. FIG. 9B illustrates the step of removing the polycrystalline Si at areas other than the top surfaces of TFTs. In the figure, numeral 92 denotes picture element transistor portion. FIG. 9C illustrates the step of removing the nitride film at areas other than the top surfaces of TFTs to lay bare only the peripheral circuit. In the figure, numerals 93, 94 and 95 denote gate oxide film, SiN and gate oxide film, respectively.

FIG. 10A illustrates the step of forming polycrystalline Si for the gate electrodes. In the figure, numeral 101 denotes gate poly-Si. FIG. 10B illustrates the step of patterning the gate electrodes.

FIG. 11A illustrates the step of ion implantation to the TFTs and the peripheral circuit to form source regions and drain regions. FIG. 11B illustrates the step of forming interlayer films.

FIG. 12A illustrates the step of depositing Al-Si that forms withdrawing electrodes. FIG. 12B illustrates the step of forming an interlayer insulating film. FIG. 12C illustrates the step of applying a surface-protecting resist.

FIG. 13A illustrates the step of depositing TiN for light-screening the TFTs, which is formed on the upper area of the TFTs. FIG. 13B illustrates the formation of transparent picture element electrodes.

FIG. 14 cross-sectionally illustrates a liquid-crystal display unit completed by combination of the above substrate with an opposing electrode having a common electrode.

According to the process as described above, transistors or the like of peripheral drive circuits can be formed by single-crystal silicon, using TFTs (thin-film transistors) as switching devices of image display portions.

The conventional liquid-crystal display units, however, have had the following problems. In the transmission type liquid-crystal display units, the light externally applied is modulated through the liquid crystal to display a desired pattern. Once the semiconductor substrate is irradiated by light, valence electrons in the semiconductor substrate are excited by the irradiation energy and converted into conduction electrons, so that vacancies formed by the escape of valence electrons turn to positive holes. Once these photocarriers called conduction electrons and positive holes (or holes) reach the source or drain of a transistor of the peripheral circuit, they cause variations of source potential or drain potential to cause misoperation of the peripheral circuit of a shift register or the like.

As another problem, once the photocarriers reach the source or drain connected to the holding capacitance that holds picture signals, they cause variations of picture signal potential to cause a lowering of display quality. When the peripheral circuit is constituted of CMOS (complimentary MOS), the variations of potential on the substrate that are caused by the photocarriers cause a phenomenon called latch-up, in which electric currents flow across a p-type MOS and an n-type MOS, resulting in no operation of the peripheral circuit.

To solve these problems, it is common to provide on the peripheral circuit a light-screening layer for cutting off light. Since, however, the substrate usually has a thickness as large as about 600 $\mu$m when the peripheral circuit is provided in the single-crystal silicon substrate as in the present structure, the silicon substrate serving as a photocarrier generating source has a great volume. Also, the diffusion length of photocarriers in the single-crystal silicon substrate is as long as several hundred $\mu$m. Hence, it is insufficient if the light is cut off on the peripheral circuit only, and an attempt to cut off the light over the surrounding area extending to several hundred $\mu$m results in an increase in chip size. There have been such problems.

Semiconductor integrated circuits commonly available are completely light-screened if incorporated into packages. In the case of photosensor integrated circuits, the substrate top surface only is subject to light, but, in the case of transmission type liquid-crystal display units, the side opposite to the side irradiated by light is also subject to stray light. Hence, measures taken only on the substrate top surface are insufficient, causing the misoperation of circuits or a lowering of display quality as stated above.

SUMMARY OF THE INVENTION

The present invention intends to solve the above problems. Accordingly, a main object of the present invention is to provide a display unit having an integrated drive circuit that can accurately operate, without misoperation even under irradiation by light not cut off by the light-screening layer and having come through.

To achieve the above object, the present inventors extensively made efforts, and have accomplished the invention described below. In the present invention, a semiconductor diffused layer capable of absorbing carriers is provided as a high-density impurity semiconductor region, at a peripheral portion of the peripheral circuit formed in the single-crystal substrate.

According to an aspect of the present invention, there is provided a display unit having an image display portion and a drive circuit which are integrally formed, wherein the drive circuit has an internal main circuit portion and, in addition thereto, a high-density impurity semiconductor region directly connected to the wiring of an electric source.

The present invention makes it possible to absorb the photoelectrons or holes that may cause misoperation of CMOS circuits or the like, and hence to produce a drive circuit integrated display unit having a drive circuit free of misoperation and having a high reliability. When the display unit is an active matrix liquid-crystal display device, a display unit having the high-density impurity semiconductor region of the present invention can be produced according to the same steps as in the conventional process.

BRIEF DESCRIPTION OF THE DRAWINGS

FIGS. 7A and 7B to FIG. 14 are diagrammatic illustrations of a process for producing a liquid-crystal display unit.

DESCRIPTION OF THE PREFERRED EMBODIMENTS

Figure 18:
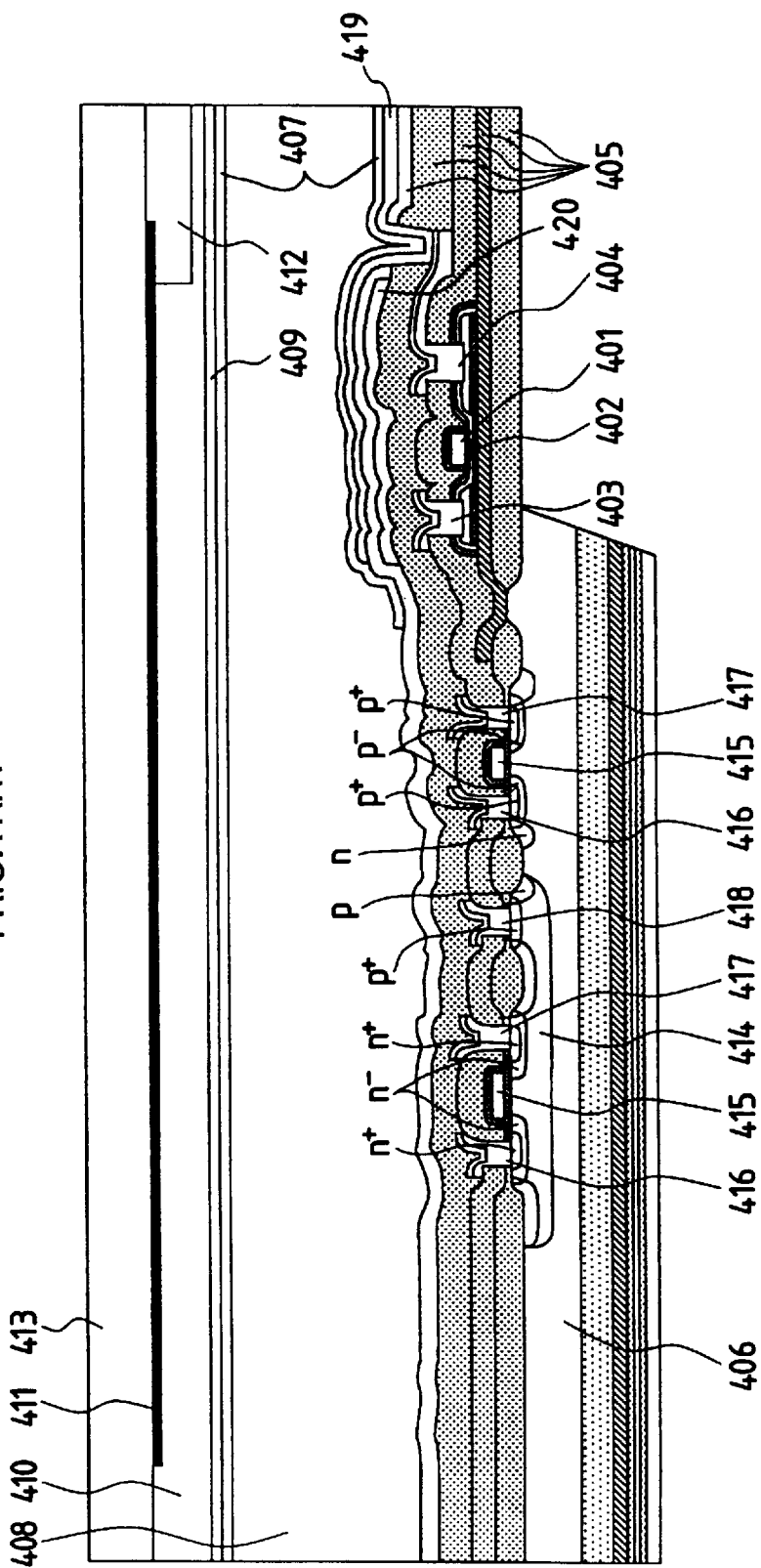
FIG. 18 is a diagrammatic cross-sectional illustration of a conventional display unit.
Figure 19A:
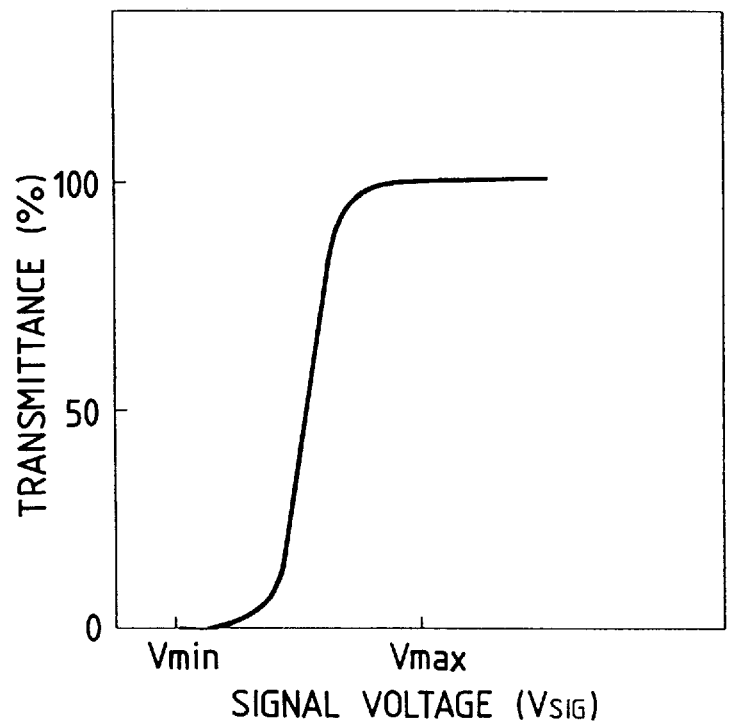
FIGS. 19A and 19B are a graphic representation of a change in transmittance and an operation diagram, respectively.
Figure 19B:
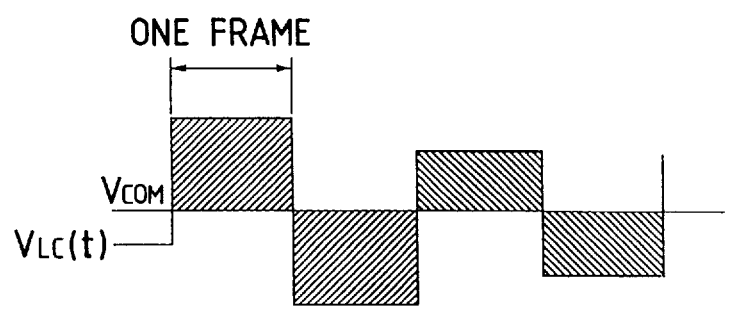

The display unit of the present invention is characterized in that a display unit has an image display portion and a drive circuit which are integrally formed, wherein the drive circuit has an internal main circuit portion corresponding to the circuit components shown at FIG. 18 and designated by reference numerals 401–405 and 414–418 in that figure, and which also are present in each figure illustrating the embodiments of the present invention discussed below and, in addition thereto, a high-density impurity semiconductor region directly connected to the wiring of an electric source. The high-density impurity semiconductor region of the present invention may be provided between the main circuit portion and the periphery of a substrate on which the drive circuit is formed, or between the main circuit portion and the image display portion. The high-density impurity semiconductor region may be provided in the manner it surround the main circuit portion, or may be provided on the opposite side of the main circuit portion. Also, the high-density impurity semiconductor region may be connected to the wiring of an electric source to have a connection area as large as possible on that region. It is better to do so in order to absorb photocarriers with good efficiency.

The display unit of the present invention may be of any type so long as it is a display unit in which a drive circuit and an image display portion are integrally formed. In particular, the present invention is effective on a liquid-crystal display unit having one substrate comprised of a semiconductor substrate and a drive circuit formed thereon and another substrate set in combination with the semiconductor substrate so that a liquid-crystal material is held between them. In such a liquid-crystal display unit, the conductivity type of the high-density impurity semiconductor region may be the same as that of the semiconductor substrate or opposite to that of the semiconductor substrate. Also, the high-density impurity semiconductor region may be provided after a well has been provided in the semiconductor substrate.

The high-density impurity semiconductor region of the present invention may be connected to either the high-potential point (Vcc) of an electric source or the low-potential point (GND) thereof. The high-density impurity semiconductor region may be formed in a trench, or may have a buried insulating layer in the vicinity thereof. The high-density impurity semiconductor region may preferably have a depth of from 0.1 to 1 μm, and may preferably have an impurity density of from $1 \times 10^{19}$ to $1 \times 10^{22}$ cm$^{-3}$. The impurities to be implanted may include As, P or B. The high potential (Vcc) of the electric source may preferably be from 5 to 30 V. The high-density impurity semiconductor region and the main circuit portion may preferably be at a distance of from 1 to 500 μm, and more preferably be at a distance of from 20 to 150 μm.

EXAMPLE 1

Figure 1:
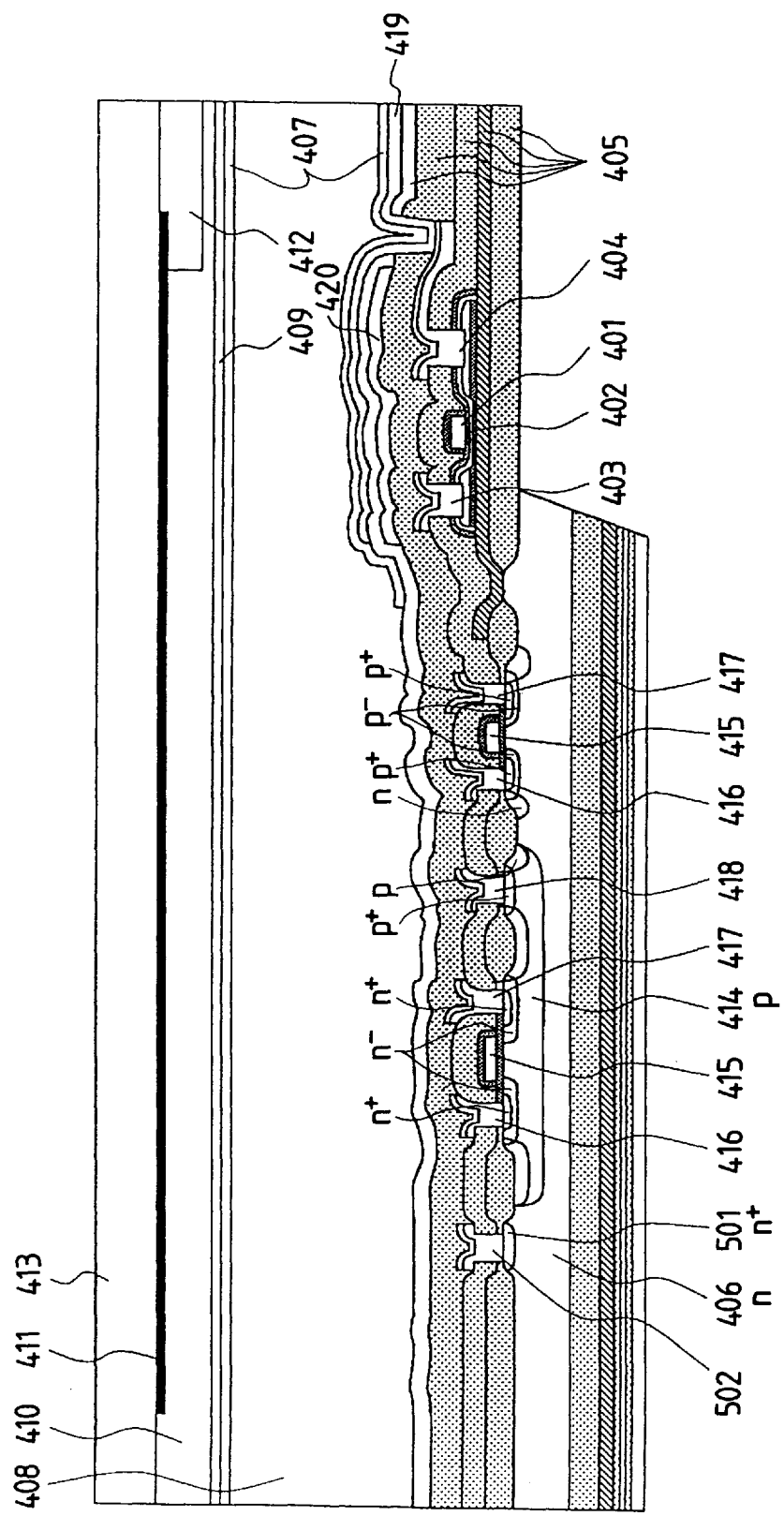
FIG. 1 is a diagrammatic cross-sectional illustration of Example 1.

FIG. 1 is an illustration best representing the feature of the present invention, and is a diagrammatic illustration of its cross-sectional structure. In FIG. 1, reference numeral 501 denotes a semiconductor diffused region (the high-density impurity semiconductor region) of the same conductivity type as the single-crystal silicon substrate, which is provided at a peripheral portion surrounding the main circuit portion of the peripheral circuit in the liquid-crystal display unit. Reference numeral 502 denotes an electrode (electric source), which is connected with the semiconductor diffused region 501.

Here, when the above substrate is assumed as an n-type substrate, the semiconductor diffused region 501 is connected through the electrode to, e.g., the highest-potential point that drives the liquid-crystal display unit. Photoelectrons generated by light irradiated through a region not covered with the light-screening layer 411 diffuse into the single-crystal silicon substrate 406 but, before they reach the transistor of the peripheral circuit, they are attracted and trapped by the electric field formed around the semiconductor diffused region 501 and can be prevented from adversely affecting the peripheral circuit. The semiconductor diffused region 501 can be simply formed in the same step as the formation of the source-drain diffused layers of the transistor of the peripheral circuit, but by no means limited thereto.

Figure 2:
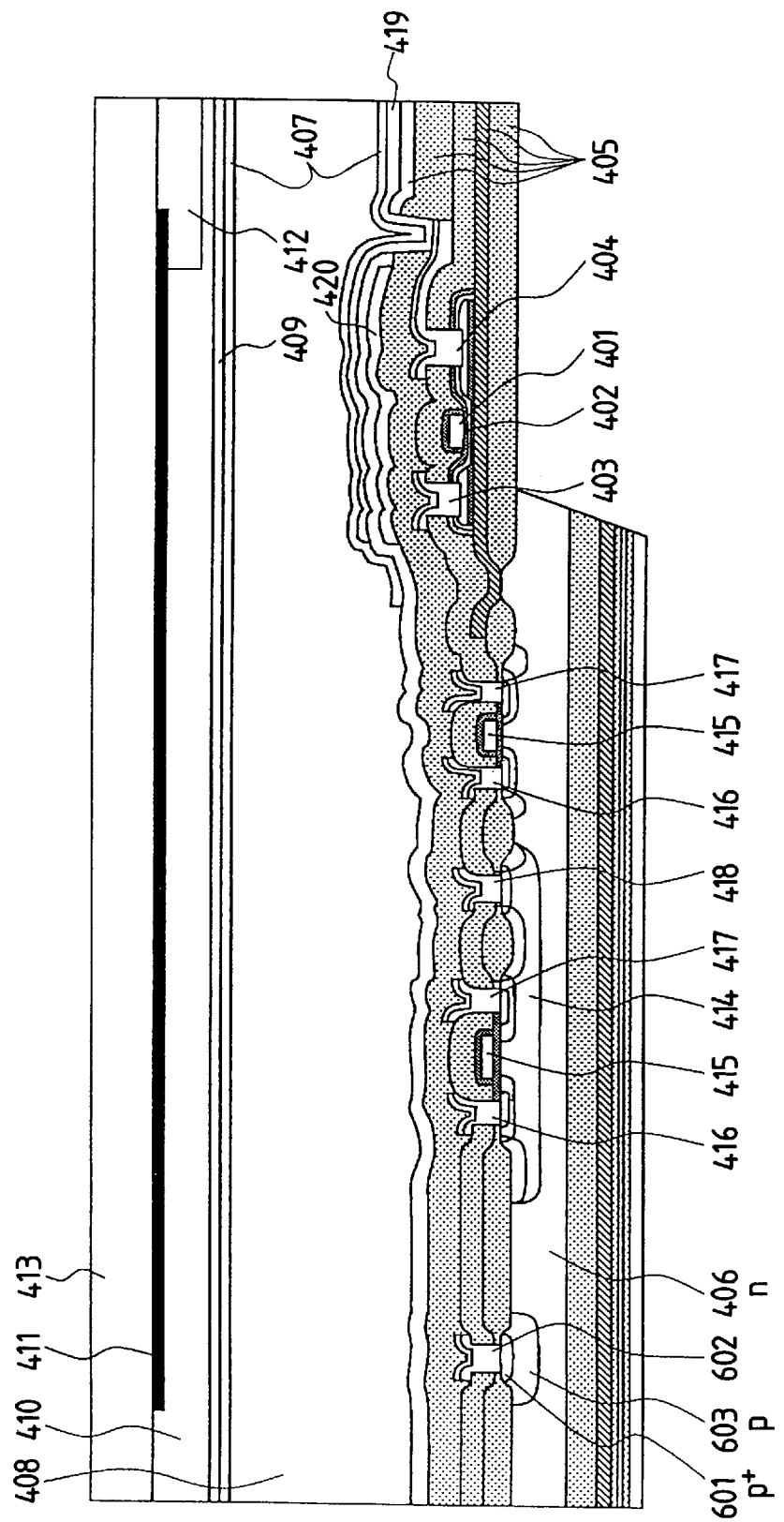
FIG. 2 is another diagrammatic cross-sectional illustration of Example 1.

The same effect can be obtained also when as shown in FIG. 2 a semiconductor diffused region 501 having a conductivity type reverse to that of the substrate is provided. In FIG. 2, reference numeral 601 denotes the semiconductor diffused region having a conductivity type reverse to that of the substrate; and 602, an electrode, which is connected with the semiconductor diffused region 601. Reference numeral 603 denotes a second semiconductor diffused region having a conductivity type reverse to that of the substrate. Here, when the substrate is assumed as an n-type substrate, the semiconductor diffused region 601 is formed in p-type conductivity. The diffused layer 601 is connected through the electrode to, e.g., the lowest-potential point that drives the liquid-crystal display unit.

Holes generated by light irradiated through a region not covered with the light-screening layer 411 diffuse into the single-crystal silicon substrate 406 but, before they reach the transistor of the peripheral circuit, they are attracted and trapped by the electric field formed around the semiconductor diffused regions 601 and 603 and can be prevented from adversely affecting the peripheral drive circuit. The reverse-conductivity type semiconductor diffused regions 601 and 603 can be simply formed in the same step as the formation of the source-drain diffused layers of the transistor of the peripheral drive circuit, but by no means limited thereto. The second semiconductor diffused region 603 is not necessarily essential, and may be omitted.

Employing such constitution of the present invention, it is possible to accomplish a high image quality transmission type liquid-crystal display unit that may cause no misoperation due to photocarriers.

As a matter not shown in the drawing, it is also effective to provide light-screening members on the upper and lower sides of the peripheral drive circuit.

The foregoing description concerns a transmission type liquid-crystal display unit. The present invention is also effective when applied to a reflection type liquid-crystal display unit. The present structure can preferably be employed especially at the silicon substrate portion where light may come through light-screening members. Namely, the present invention may be used in not only the peripheral circuit portion as described above but also the picture element region.

EXAMPLE 2

Figure 3:
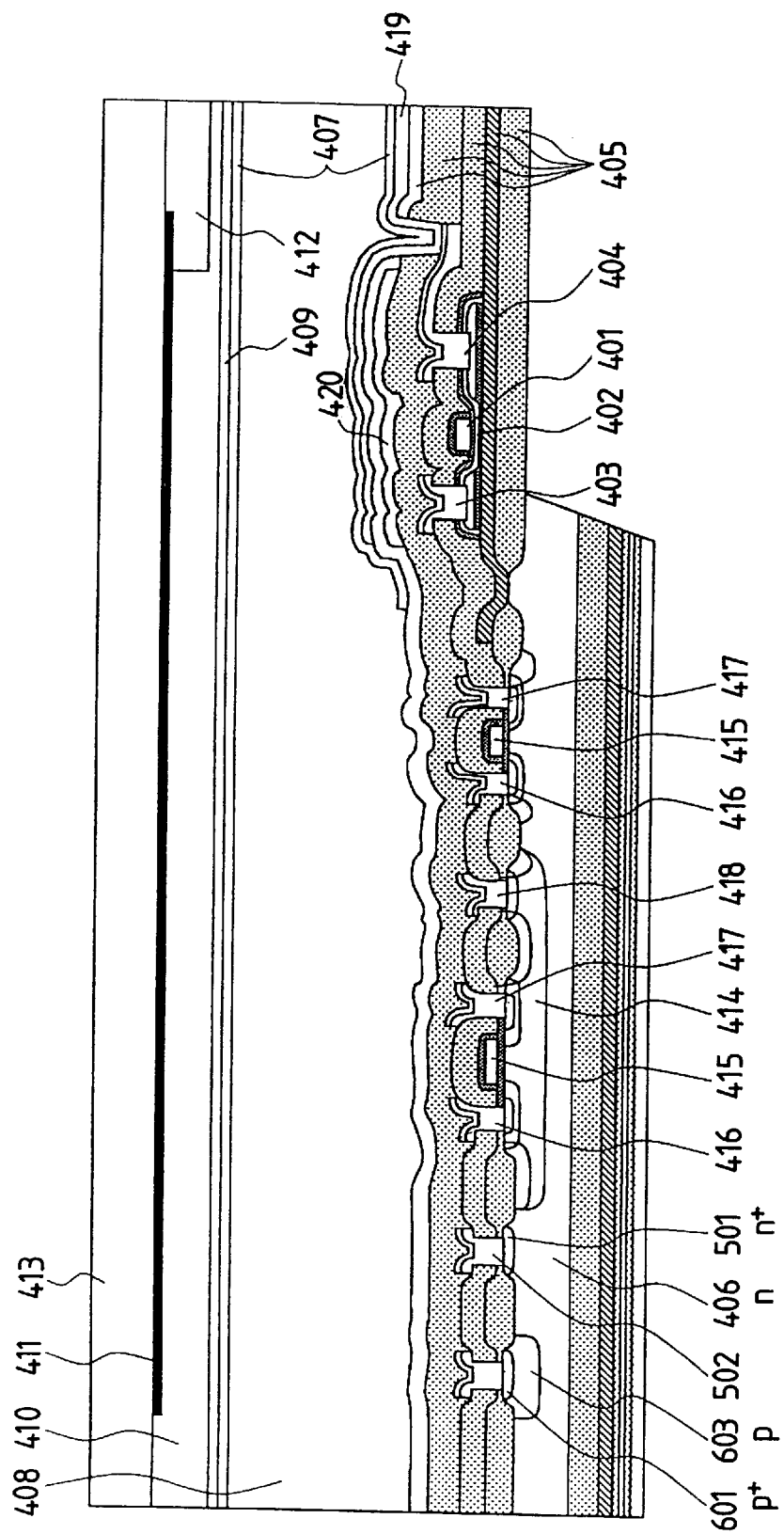
FIG. 3 is a diagrammatic cross-sectional illustration of Example 2.

FIG. 3 is an illustration best representing the feature of Example 2. Both the semiconductor diffused region 501 of the same conductivity type as the substrate and the semiconductor diffused region 601 having a conductivity type reverse to that of the substrate are formed in the same manner as those in Example 1, and are each assigned to the corresponding potential, whereby both the photoelectrons and the holes generated by light can be trapped.

EXAMPLE 3

Figure 4:
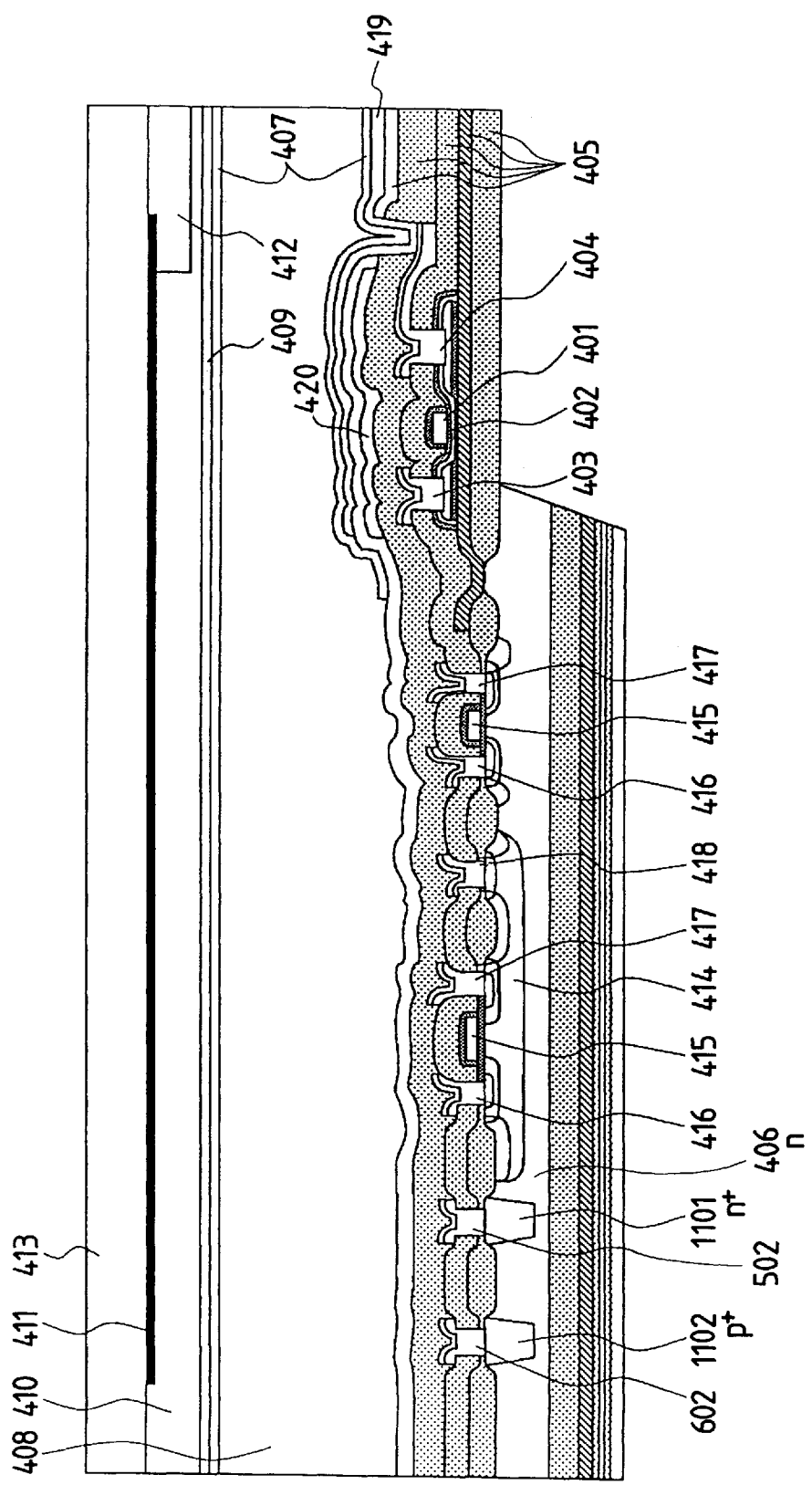
FIG. 4 is a diagrammatic cross-sectional illustration of Example 3.

FIG. 4 is also an illustration best representing the feature of the present Example. Reference numeral 1101 denotes a photocarrier trapping region formed by etching the substrate to form what is called a trench with a depth of from several μm to tens of μm and burying therein a semiconductor diffused region of the same conductivity type as the substrate. Reference numeral 1102 denotes a second photocarrier trapping region similarly formed by burying in a trench a semiconductor layer having a conductivity type reverse to that of the substrate. Formation of such photocarrier trapping regions in a depth of up to several μm to tens of μm makes it possible to surely trap the photocarriers diffusing through the inside of the substrate.

EXAMPLE 4

Figure 5:
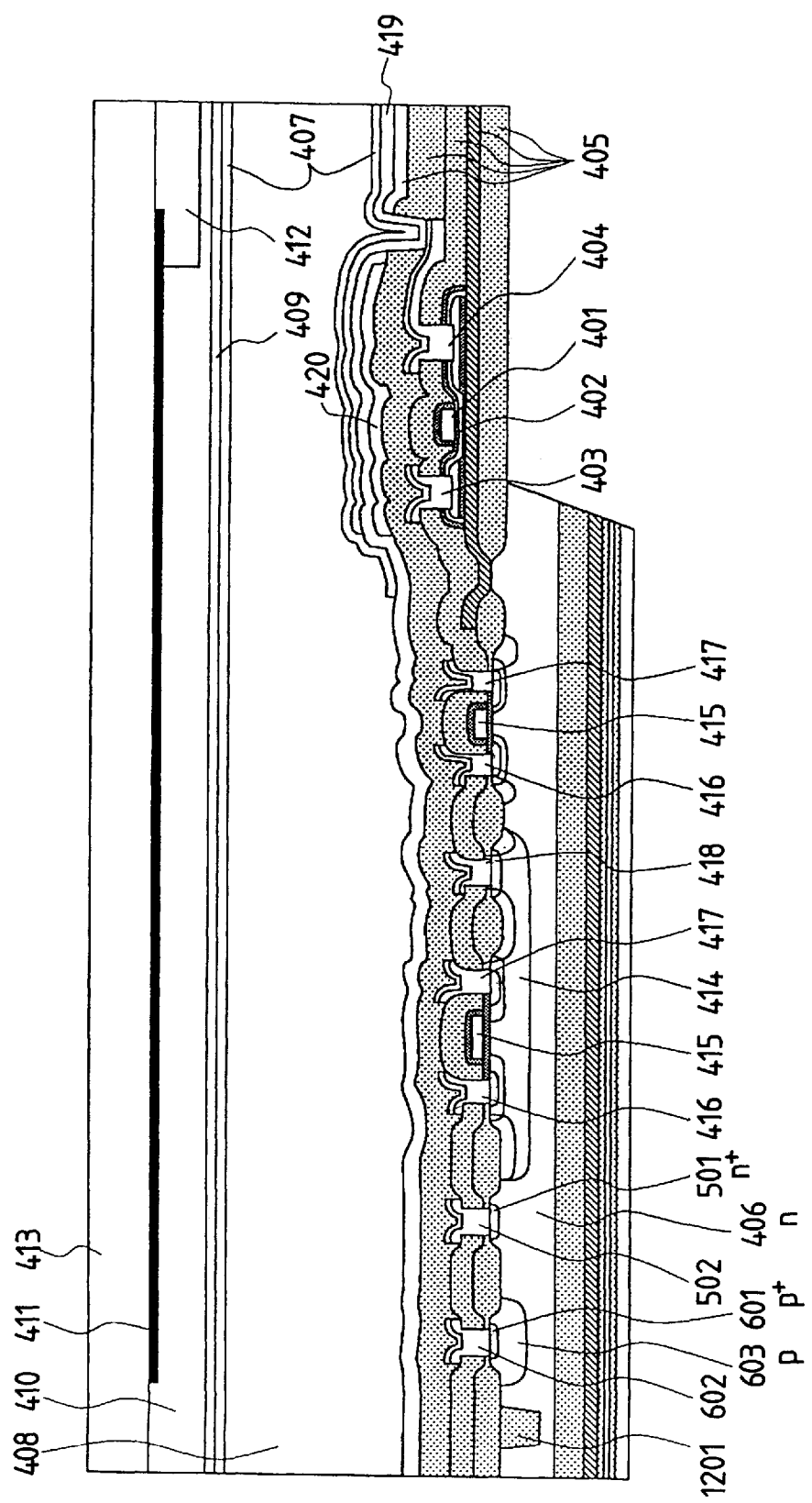
FIG. 5 is a diagrammatic cross-sectional illustration of Example 4.

FIG. 5 is an illustration best representing the feature of the present Example. Reference numeral 1201 denotes a buried insulating layer formed by etching the substrate to form what is called a trench with a depth of from several μm to tens of μm and burying therein an insulating layer. Photocarriers can not diffuse into insulating layers, and hence must go around the buried insulating layer 1201, in the course of which the carriers recombine to disappear, so that the number of photocarriers reaching the peripheral circuit becomes much smaller.

EXAMPLE 5

Figure 6:
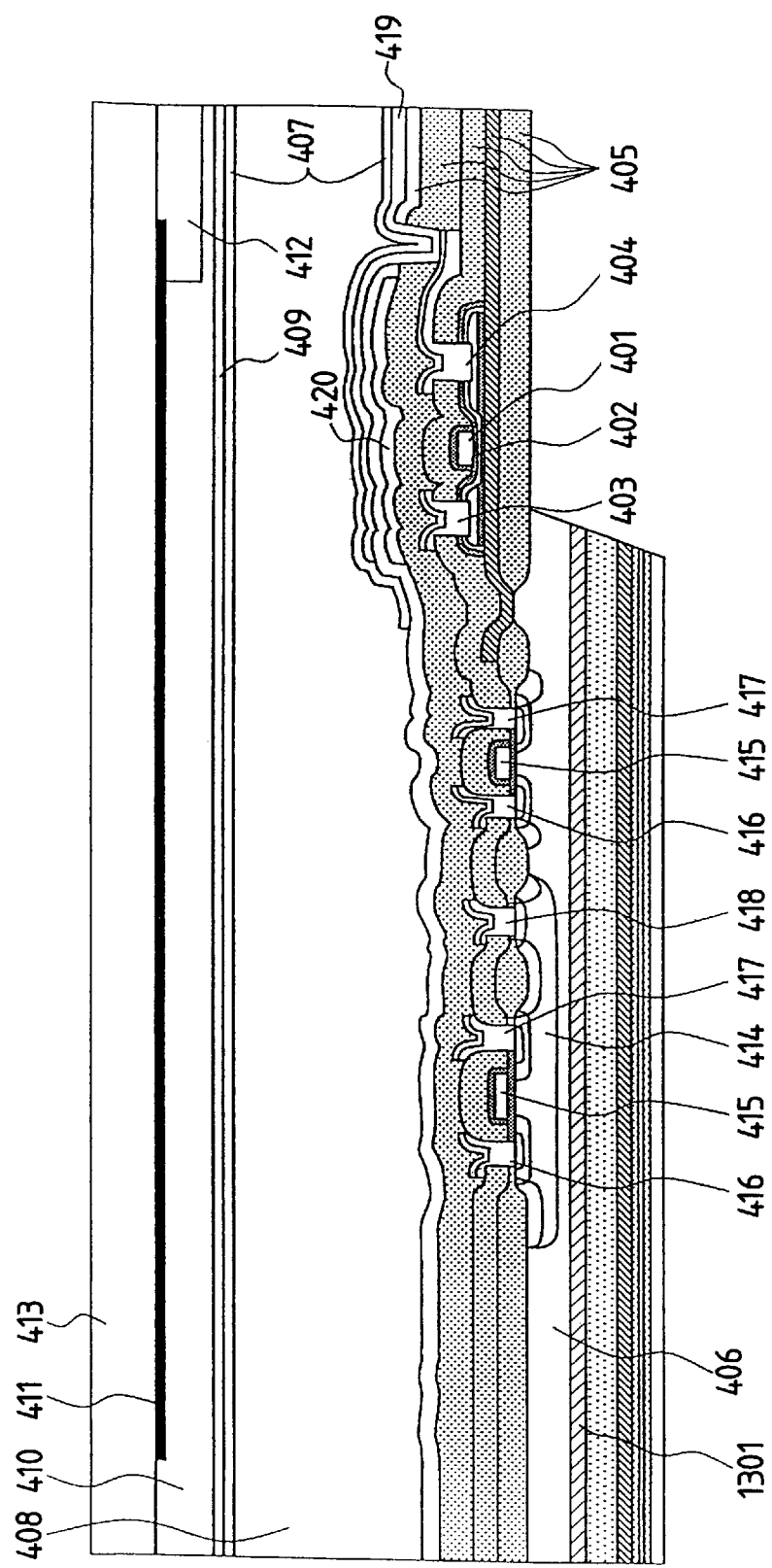
FIG. 6 is a diagrammatic cross-sectional illustration of Example 5.
Figure 7A:
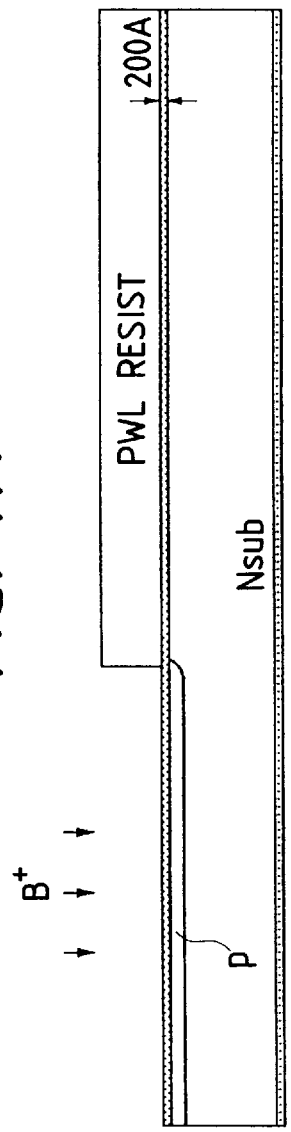
Figure 7B:
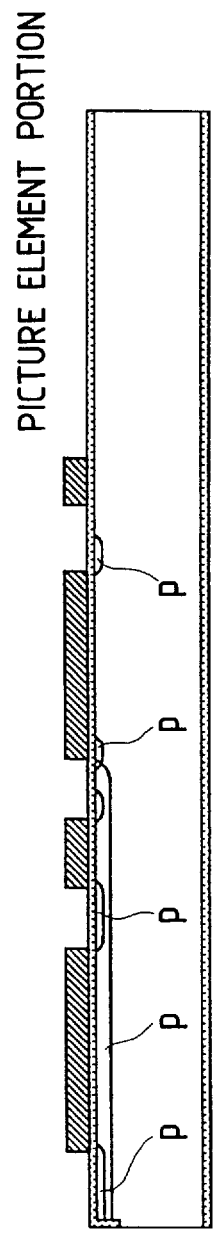
Figure 8A:
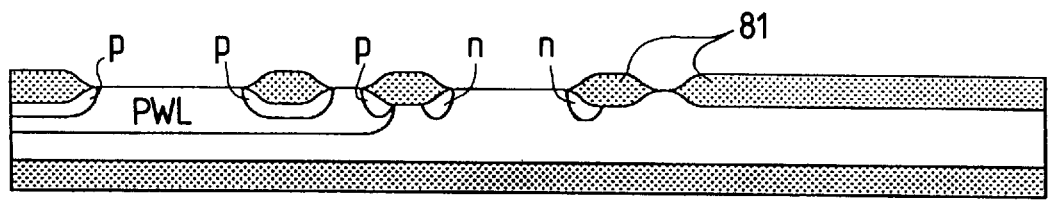
Figure 8B:
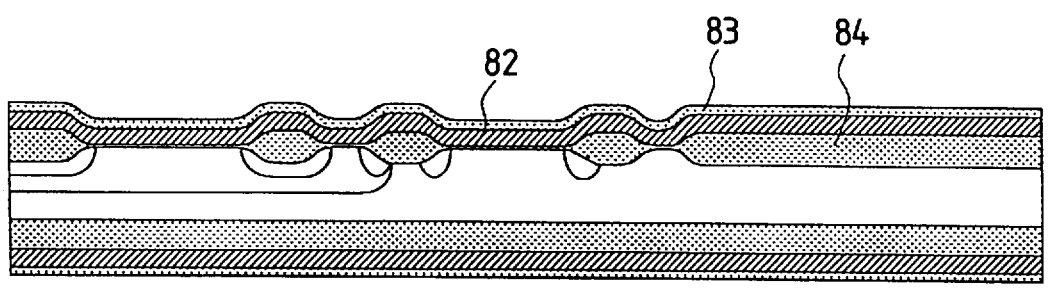
Figure 8C:
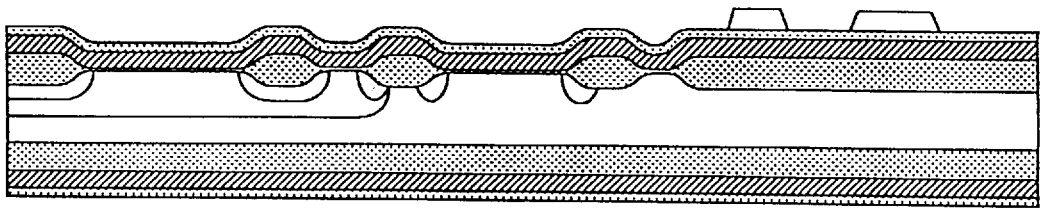
Figure 9A:
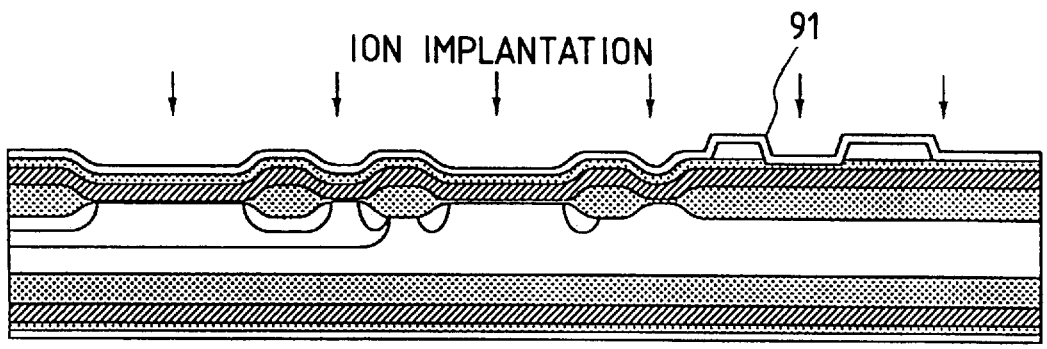
Figure 9B:
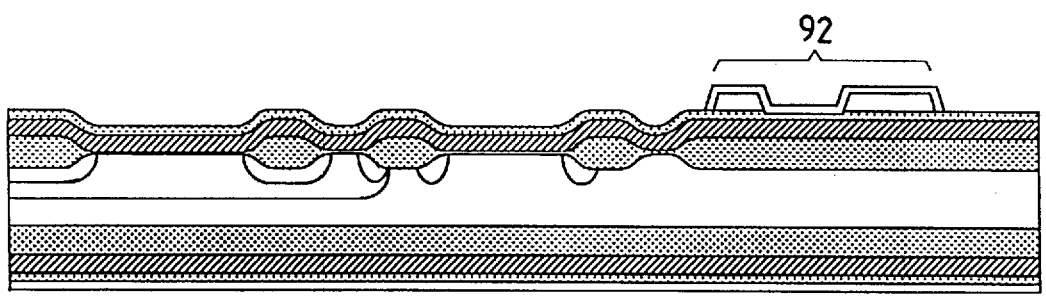
Figure 9C:
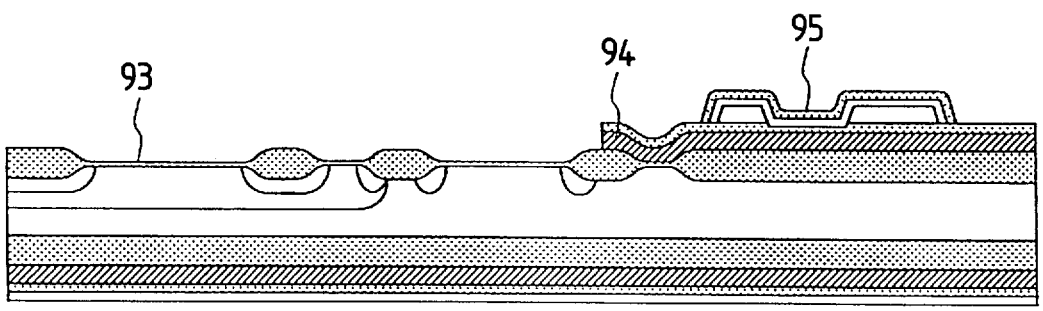
Figure 10A:
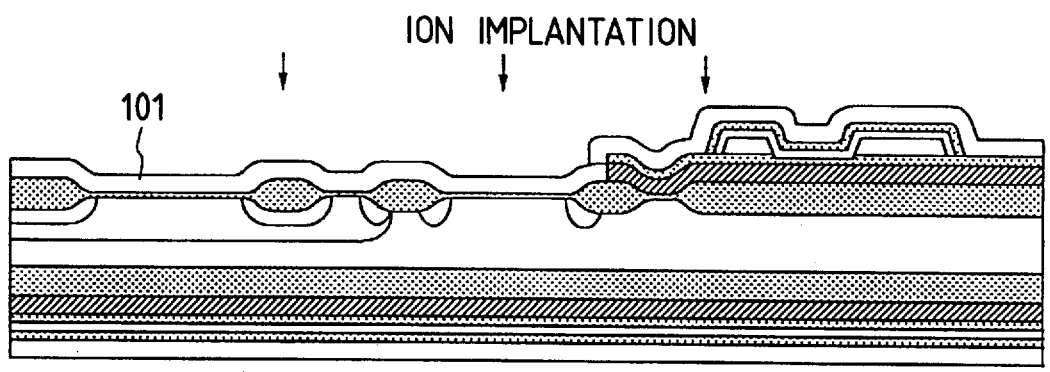
Figure 10B:
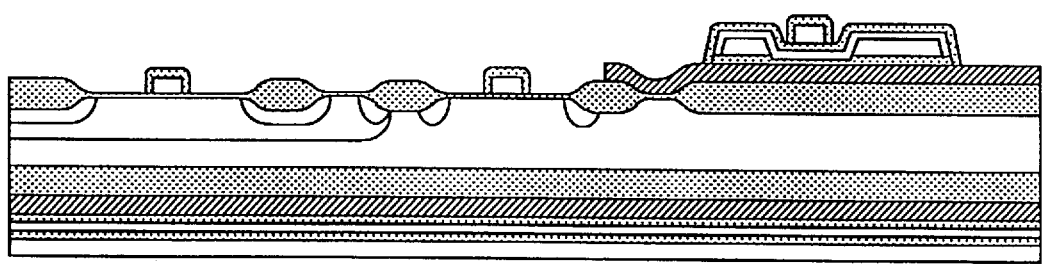
Figure 11A:
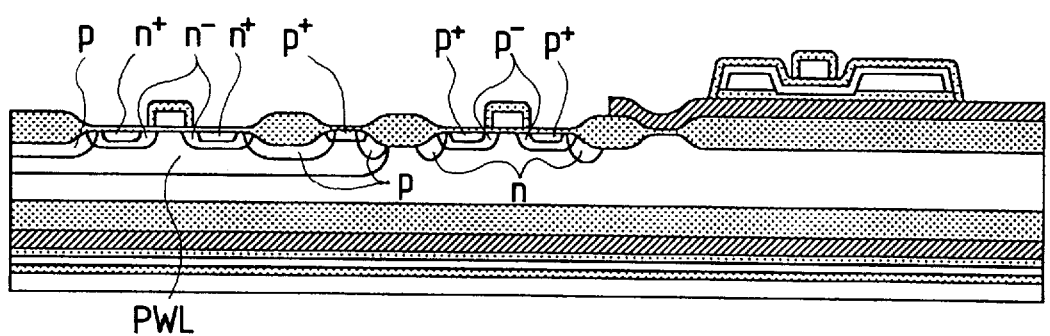
Figure 11B:
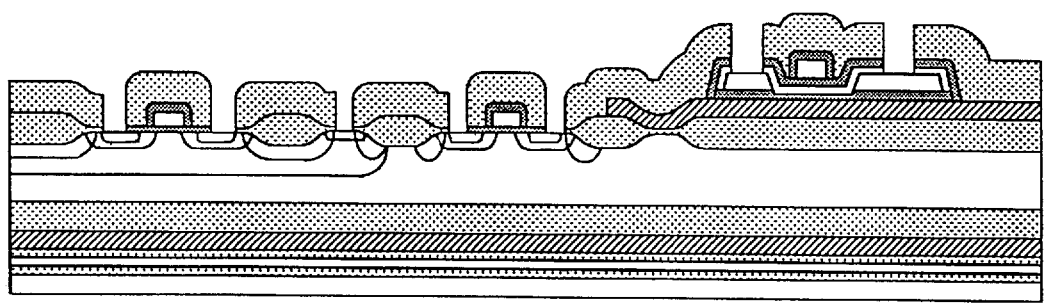
Figure 12A:
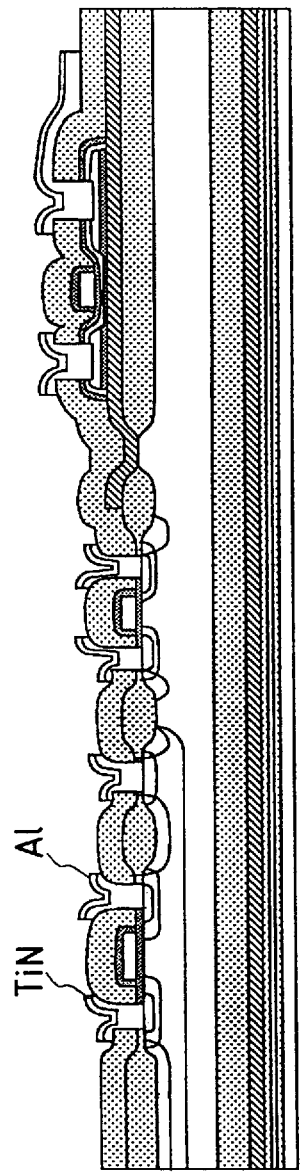
Figure 12B:
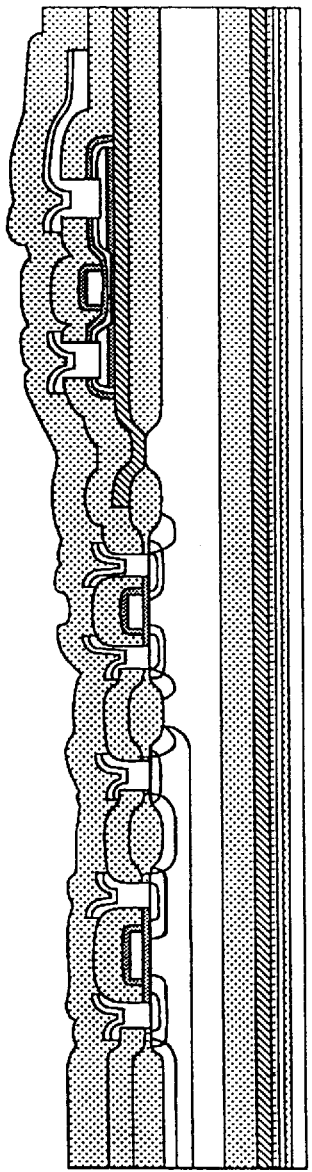
Figure 12C:
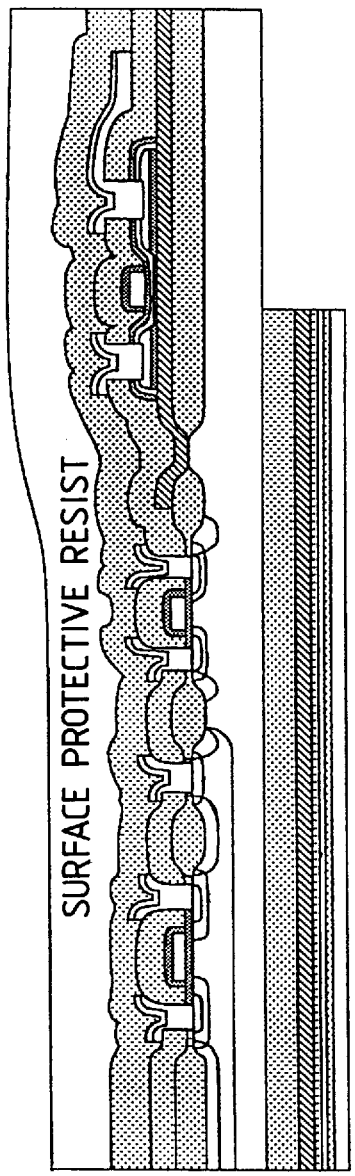
Figure 13A:
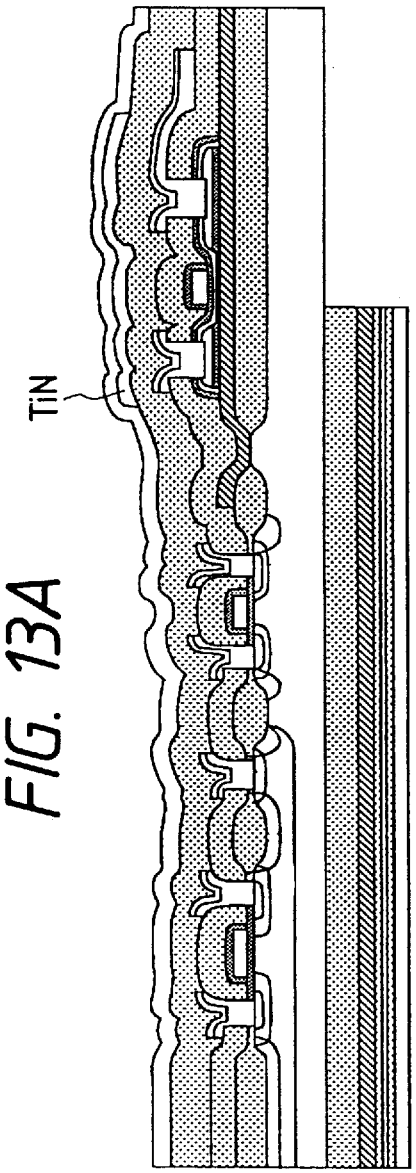
Figure 13B:
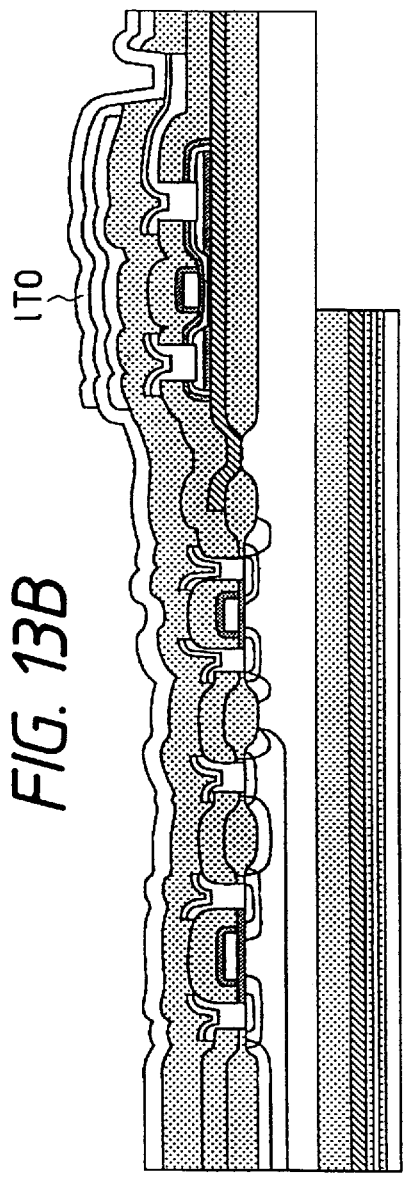
Figure 14:
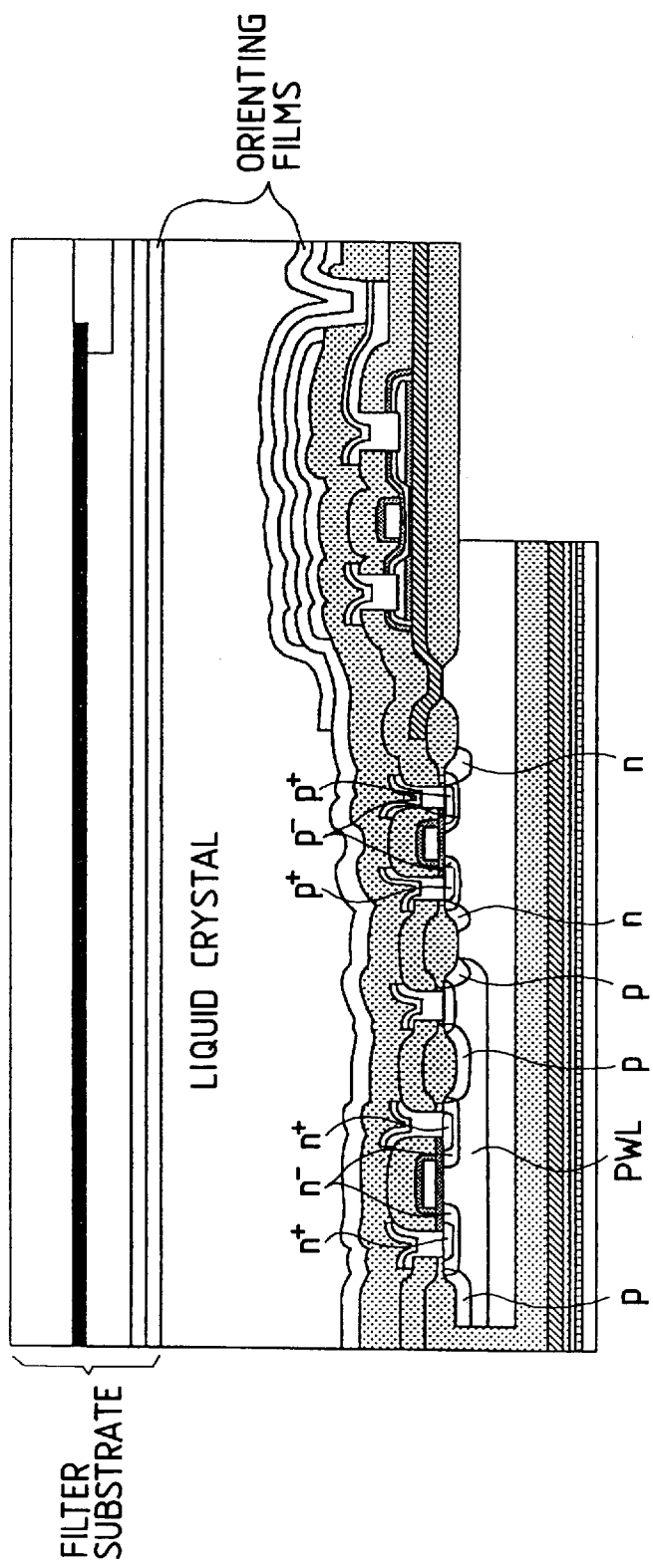
Figure 15:
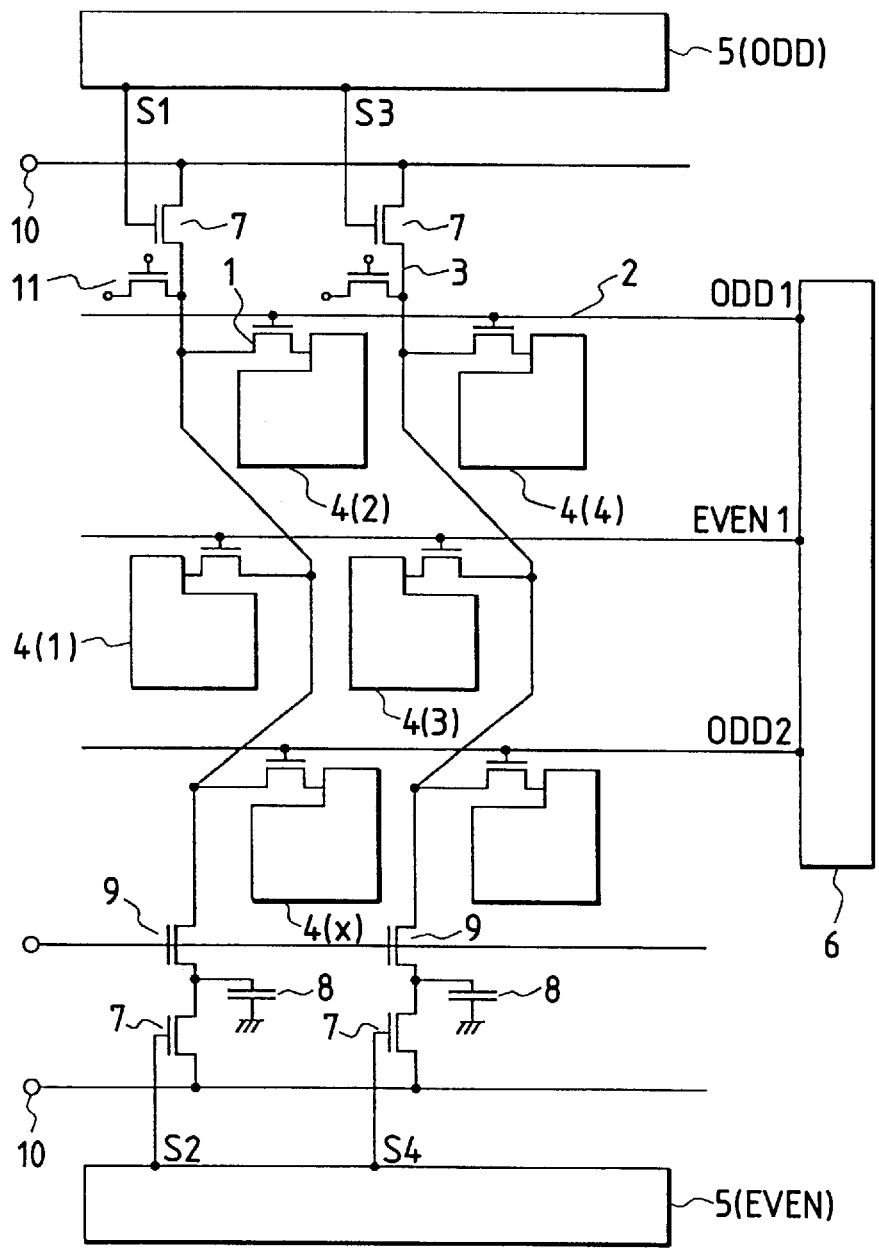
FIG. 15 illustrates an equivalent circuit of a liquid-crystal display unit.
Figure 16:
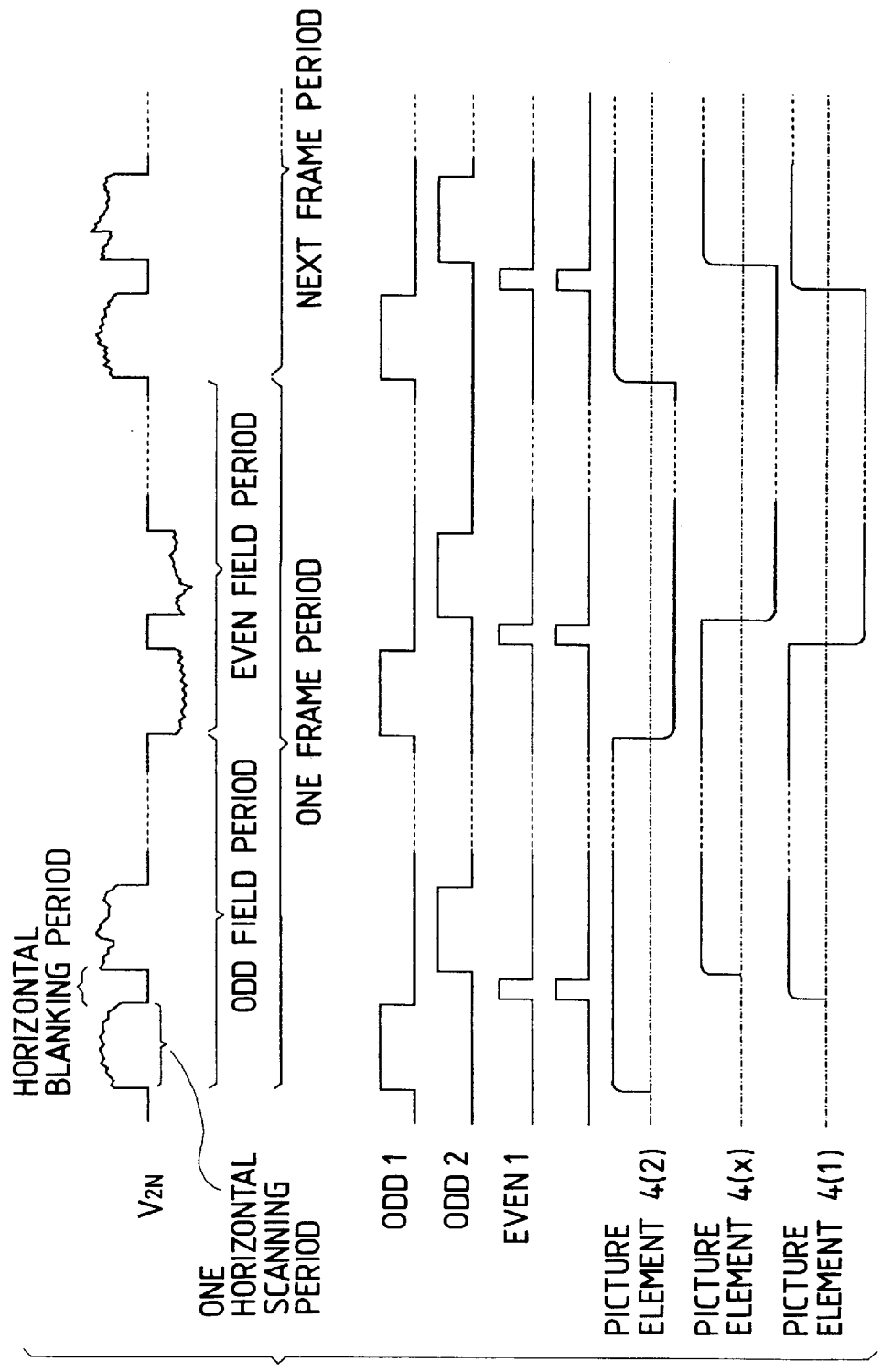
FIG. 16 is a drive timing diagram of the liquid-crystal display unit.
Figure 17:
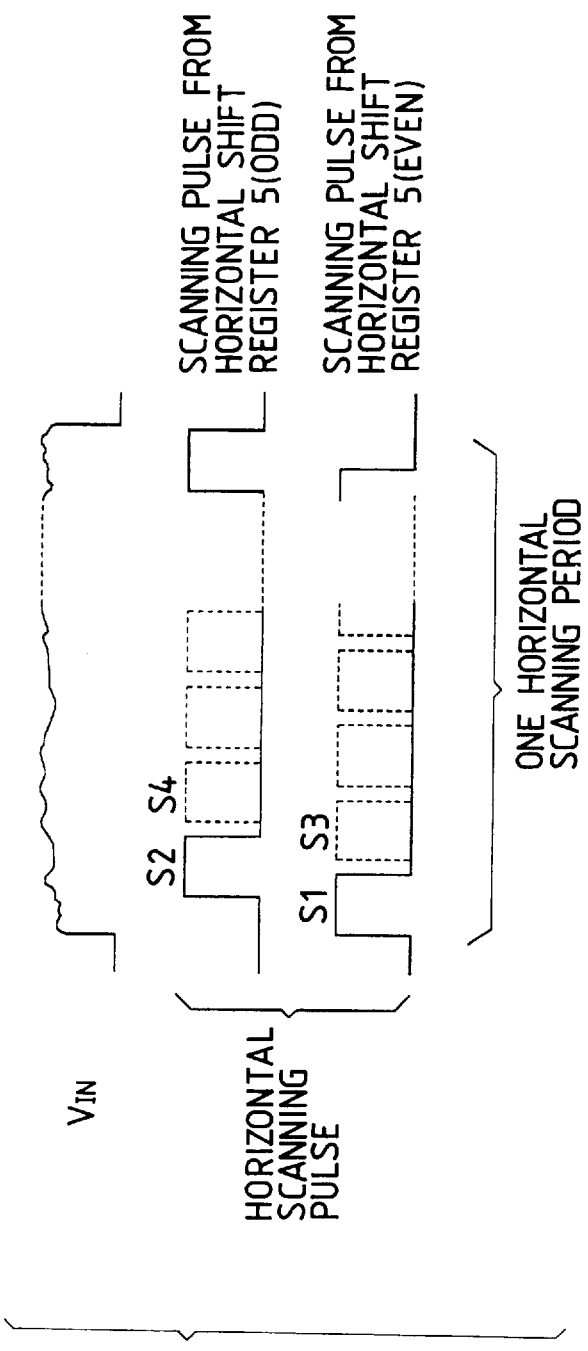
FIG. 17 is a drive timing diagram of the liquid-crystal display unit.

FIG. 6 is an illustration best representing the feature of the present Example. Reference numeral 1301 denotes a semiconductor diffused layer formed on the back of the single-crystal silicon substrate 406. This semiconductor diffused layer 1301 is formed by ion implantation or the like applied from the back of the substrate. As illustration is omitted in FIG. 6, the semiconductor diffused layer 1301 is connected with an electrode by bonding or the like so that its potential is taken.

As previously stated, the transmission type liquid-crystal display unit is subject to light from the both sides of the substrate, and hence are more greatly affected by photocarriers than usual semiconductor integrated circuits. In the present Example, however, the semiconductor diffused layer 1301 is formed on the back of the single-crystal silicon substrate 406 and its potential is taken so that the photocarriers generated by the light irradiated on the back of the substrate or the light straying about it can be trapped. What is shown in FIG. 6 is an example in which the semiconductor diffused region is formed on the back of the substrate. In addition to such a region, another semiconductor diffused layer may be formed on a substrate end face made bare by etching away the back surface, whereby the photocarriers can be more surely trapped.

As described above, the working of the present invention makes it possible to prevent photocarriers from flowing into peripheral drive circuits, caused by the light having not been cut off and having come through, so that the display unit can be free from a lowering of display quality, due to misoperation of circuits or variation of signal potential. Furthermore, the present invention makes it possible to realize various misoperation-free display units including liquid-crystal television sets, liquid-crystal projector television sets, liquid-crystal view finders, liquid-crystal head-mount display units and computer display units, all having a high image quality.

What is claimed is:

1. A display unit having an image display portion and a drive circuit which are integrally formed, wherein the drive circuit has an internal main circuit portion and a high-density impurity semiconductor region, for absorbing photocarriers, directly connected to a wiring of an electric source.

2. The display unit according to claim 1, wherein said high-density impurity semiconductor region is provided between the main circuit portion and a periphery of a substrate on which the drive circuit is formed.

3. The display unit according to claim 1, further comprising a substrate, wherein the main circuit portion is formed on a first side of said substrate, and said high-density impurity semiconductor region is provided on a second side of said substrate opposite to said first side.

4. The display unit according to claim 1, wherein said drive circuit is formed on a single-crystal semiconductor substrate, and said high-density impurity semiconductor region has a conductivity type reverse to that of the single-crystal semiconductor substrate.

5. The display unit according to claim 4, wherein said single-crystal semiconductor substrate is formed of bulk Si.

6. The display unit according to claim 1, wherein said drive circuit is formed on a single-crystal semiconductor substrate, and said high-density impurity semiconductor region has a same conductivity type as the single-crystal semiconductor substrate.

7. The display unit according to claim 1, wherein said wiring is connected to a high-potential point (Vcc) of the electric source.

8. The display unit according to claim 7, wherein said high-potential point (Vcc) has a voltage of from 5 V to 30 V.

9. The display unit according to claim 1, wherein said wiring is connected to a low-potential point (GND) of the electric source.

10. The display unit according to claim 1, wherein said high-density impurity semiconductor region is formed in a trench.

11. The display unit according to claim 1, wherein said high-density impurity semiconductor has a buried insulating layer in the vicinity thereof.

12. The display unit according to claim 1, wherein said high-density impurity semiconductor region has a depth of from 0.1 $\mu$m to 1 $\mu$m.

13. The display unit according to claim 1, wherein said high-density impurity semiconductor region is formed by implantation of As.

14. The display unit according to claim 1, wherein said high-density impurity semiconductor region is formed by implantation of P.

15. The display unit according to claim 1, wherein said high-density impurity semiconductor region is formed by implantation of B.

16. The display unit according to claim 1, wherein said high-density impurity semiconductor region has an impurity density of from $1 \times 10^{19}$ cm$^{-3}$ to $1 \times 10^{22}$ cm$^{-3}$.

17. The display unit according to claim 1, wherein said high-density impurity semiconductor region and said main circuit portion are at a distance of from 1 $\mu$m to 500 $\mu$m.

18. The display unit according to claim 1, wherein said display unit is a liquid-crystal display unit, said image display portion having a pair of substrates, and a liquid-crystal material being held between the pair of substrates.

19. The display unit according to claim 18, wherein said liquid-crystal display unit is an active matrix liquid-crystal display device, said image display portion having a switching device for each picture element.

20. The display unit according to claim 19, wherein said switching device is a thin-film transistor.

21. The display unit according to claim 20, wherein said thin-film transistor is formed of polycrystalline Si.

* * * * *

UNITED STATES PATENT AND TRADEMARK OFFICE
CERTIFICATE OF CORRECTION

PATENT NO. : 5,812,231

DATED : September 22, 1998

INVENTOR(S): TETSUNOBU KOCHI ET AL.

Page 1 of 2

It is certified that error appears in the above-identified patent and that said Letters Patent is hereby corrected as shown below:

ON COVER PAGE AT [76] INVENTORS

"[76] Inventors: Tetsunobu Kochi; Mamoru Miyawaki; Shunsuke Inoue; Takanori Watanabe, all c/o Canon Kabushiki Kaisha 30-2, 3-chome; Shimomaruko, Ohta-ku, Tokyo, Japan"

should read

--[76] Inventors: Tetsunobu Kochi, Hiratsuka; Mamoru Miyawaki, Isehara; Shunsuke Inoue, Yokohama; Tananori Watanabe, Atsugi, all of Japan--.

COLUMN 2

Line 4, "of" should be deleted;
Line 37, "twist" should read --twisted--.

UNITED STATES PATENT AND TRADEMARK OFFICE
CERTIFICATE OF CORRECTION

PATENT NO. : 5,812,231

DATED : September 22, 1998

INVENTOR(S): TETSUNOBU KOCHI ET AL.

It is certified that error appears in the above-identified patent and that said Letters Patent is hereby corrected as shown below:

COLUMN 6

Line 55, "surround" should read --surrounds--.

COLUMN 8

Line 59, "can not" should read --cannot--.

Signed and Sealed this

Twenty-ninth Day of June, 1999

*Attest:*

Q. TODD DICKINSON

*Attesting Officer*     Acting Commissioner of Patents and Trademarks